United States Patent [19]

Johnson

[11] Patent Number: 4,758,798

[45] Date of Patent: Jul. 19, 1988

[54] OUTPUT AMPLIFIER

[75] Inventor: William A. Johnson, Minneapolis, Minn.

[73] Assignee: Cross Technoloty, Inc., Eden Prairie, Minn.

[21] Appl. No.: 36,918

[22] Filed: Apr. 10, 1987

[51] Int. Cl.⁴ ............................................. H03F 1/34
[52] U.S. Cl. ...................................... 330/293; 330/85; 330/102
[58] Field of Search ................. 330/85, 102, 288, 293; 323/315, 316

[56] References Cited

U.S. PATENT DOCUMENTS 3,665,331  5/1972  Wiarda ........................... 330/102 X Primary Examiner—James B. Mullins
Attorney, Agent, or Firm—Kinney & Lange

[57] ABSTRACT

An amplifier system providing the voltage feedback which can be supplemented with current feedback without limiting the voltage excursion range at the amplifier system output.

19 Claims, 1 Drawing Sheet

OUTPUT AMPLIFIER

BACKGROUND OF THE INVENTION

1. Field of the Invention

The present invention relates to amplifiers used at the end of an amplification signal path and, more particularly, to amplifiers used for connecting to a load device having an electrical characteristic exhibiting resonances.

An amplifier used at the end of the signal path in an amplification portion of an analog system is usually connected to a load device which is to be driven by signals larger in magnitude but more or less following the signal waveform provided at the beginning of the particular amplification portion of the system upon which amplification is performed. For a simple load device, this usually causes no problem beyond having adequate power available at the amplifier output to drive this load device as directed by the amplified signal. For more complex load devices, however, further measures may be needed because of the complex electrical impedance characteristics that such devices can exhibit.

A typical complex load device would be a speaker, ranging from a hearing aid speaker to a public address system speaker. Such speakers have electrical characteristics which depend not only on the electrical materials present, but also the mechanical construction of the load device and the acoustical surroundings in which such a device is placed. That is, the electrical impedance characteristic of the device will reflect therein mechanical structural resonances modified by, and perhaps added to by, resonances arising as a result of the acoustical impedance faced by the speaker. The occurrance of such resonances leads to uneven performance across the frequency range in which the system is to perform.

Improvements in these resonance characteristics to reduce differences between different parts of the operating frequency spectrum of the system are usually obtained through the use of negative feedback from the amplifier output to a point earlier along the amplifier signal path. Voltage feedback is commonly used, and in some systems has been supplemented by current feedback. The latter, however, has been obtained through sensing the current passing through the load which reduces the range of output voltage over which the load can be driven. Thus, an output amplifier is desired, particularly in low supply voltage situations, which can control resonances in the load device without limiting the voltage range over which such a device may be driven.

SUMMARY OF THE INVENTION

The present invention provides an output amplifier having a first controlled current controller at the amplifier input to the output of which are connected the inputs of two other controlled current controllers. The outputs of these latter controllers are each connected through impedances to the input of a further controlled current controller which has its output connected to the output of the first controlled current controller. Such controllers are conveniently implemented using bipolar transistors. A means for limiting excursions of the signals in the amplifier is also provided.

DETAILED DESCRIPTION OF THE PREFERRED EMBODIMENTS

Figure 1:
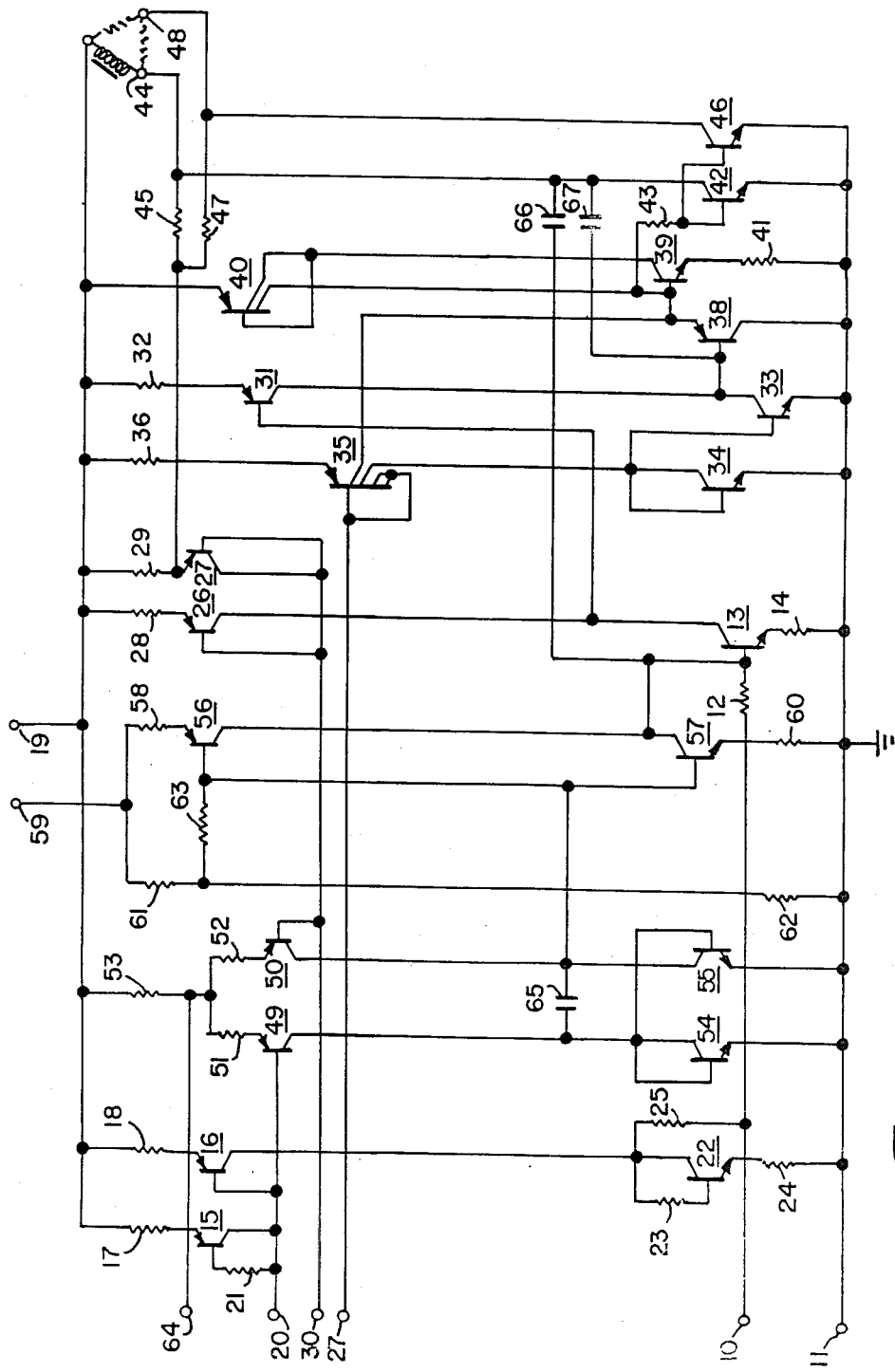
FIG. 1 is a schematic diagram of the present invention.

FIG. 1 shows a schematic diagram of an output amplifier suitable for use with a low voltage power supply in monolithic integrated circuit form. This amplifier has an input, 10, with respect to a ground reference voltage terminal, 11. Input 10 is connected through a resistor 12, to the base of an input npn bipolar transitor, 13. The emitter of transistor 13 is electrically connected through a resistor, 14, to ground reference terminal 11. Thus, the current drawn at the collector of transistor 13 is set by the voltage on input 10 and by the bias current supplied at the base thereof to be described.

Bias current is supplied to transistor 13 at its base through resistor 12 by means of a current source and a reference transistor. The current source is formed by two pnp bipolar transistors, 15 and 16, each of which is connected through an emitter resistor, 17 and 18, respectively, to a positive voltage supply terminal, 19, adopted for connection to a source of positive voltage such as a battery. The base of transistor 16 is connected to a further terminal means, 20, adapted for connection to a first current sink which sinks a well regulated current. The base of transistor 15, through a further resistor, 21, is also connected to terminal 20 as is the collector of transistor 15.

Transistors 15 and 16 are closely matched as are resistors 17 and 18. As a result, the current sunk by the regulated current source connected to terminal 20 will be primarily supplied by the collector of transistor 15, although a slight portion of it will be due to the bases of the various transistors connected to terminal 20. A nearly identical current will flow from the collector of transistor 16 as the base and emitter of transistor 16 are in electrical conditions very similar to the base and emitter of transistor 15. Resistors 17 and 18 help stabilize the currents in each of transistors 15 and 16 over changing circuit conditions in operation, reduce the effects of any mismatching between transistors 15 and 16, and raise the effective output impedance occurring at the collector of transistor 16.

The collector current of transistor 16 is supplied to the collector of a further npn bipolar transistor, 22. A slight amount of the current from the collector of transistor 16 is provided to the base of transistor 22 through a further resistor, 23. These currents are carried through transistor 22 out its emitter, and then through a further resistor, 24, electrically connected to ground reference terminal 11. Resistor 24 helps stabilize the voltage at the collector of resistor 22. That collector is connected through another resistor, 25, to the base of transistor 13 through resistor 12 to thereby supply a base bias current.

The current to the collector of transistor 13 is provided by two sources, a controlled current source and the input of the next amplificatition stage. The controlled current source is formed by a pair of pnp bipolar transistors, 26 and 27, and a corresponding pair of resistors, 28 and 29, respectively, each electrically connecting the corresponding emitters to voltage supply terminal means 19. As in the previously described current source, the base and collector of transistor 27 are each electrically connected to a further terminal means, 30, which is connected to another current sink which sinks a well regulated current. Again, this current is primarily supplied by the collector of transistor 27, although, again, a slight portion is supplied by the transistor bases connected to terminal 30. Since transistors 26 and 27 are well matched to one another, as are resistors 28 and 29, and since the base of transistor 26 is also connected to terminal 30, the collector of transistor 26 will provide a current essentially identical to that supplied by the collector of transistor 27. This collector current of transistor 26 can be altered because of the incoming connection at the junction of transistor 27 and resistor 29, as will be described later.

Again, resistors 28 and 29 stabilize the current supplied by this current source under changing circuit conditions, reduce the effects of any mismatching between transistors 26 and 27, and raise the effective impedance at the collector of transistor 26. Further, if the transistors used to make up this current source happen to have low current gains, there can be an increase in the voltage at the emitters of transistors 26 and 27. Resistors 21 and 23 approximately compensate for this effect.

The other current drawn at the collector of transistor 13 is supplied from the base of a pnp bipolar transistor, 31, having its emitter electrically connected through a resistor, 32, to positive voltage supply terminal 19. The collector load of transistor 31 is formed by an npn bipolar transistor, 33, serving as a current sink. The current value to be sunk at the collector of transistor 33 and passed through its emitter to ground reference terminal 11 is set by a diode-connected npn bipolar transistor, 34. The collector of transistor 34 is electrically connected to its base and to the base of transistor 33. The emitter of transistor 34 is electrically connected to ground reference terminal 11.

The base and collector of transistor 34 are supplied current from a multiple collector pnp bipolar transistor, 35, having its emitter connected through a resistor, 36, to positive voltage supply terminal 19. Transistor 35 will operate as a current source in much the same manner as the current source formed by transistors 26 and 27. The base of transistor 35 is connected to a terminal means, 27, which is adapted for connection to a well regulated current sink. Transistor 35 has four separate collectors, two of which are electrically connected together and to the base of transistor 35. In this arrangement, the other two collectors will each supply approximately the same current as one of the collectors shorted to the base of transistor 35, each of the collectors being matched in construction to the others.

A voltage signal impressed on amplifier input 10, then, will change the current value to be sunk at the collector of transistor 13. This change in current value must be satisfied by changes in the current supplied by the collector of transistor 26 and the base of transistor 31. Changes in the base current of transistor 31 are amplified by the remaining portions of the amplifier to its output, and changes at the output are reflected through a feedback arrangement to provide changes in the current supplied by the collector of transistor 26, as will be explained below.

The portion of the current required to be sunk at the collector of transistor 33, which is not supplied by transistor 31, must be supplied by the base of a further pnp bipolar transistor, 38, which has its emitter electrically connected to the remaining collector of transistor 35. Also electrically connected to the emitter of transistor 38 is the base of a further npn bipolar transistor, 39, and a collector of another multicollector pnp bipolar transistor, 40, serving as a controlled current source. The emitter of transistor 39 is electrically connected through a resistor, 41, to ground reference terminal 11. The emitter of transistor 40 is directly electrically connected to positive voltage supply terminal 19. The collector of transistor 39 is electrically connected to one of the two collectors of transistor 40, which collector is also electrically connected to the base of transistor 40. Finally, the base of transistor 39 is also electrically connected to the base of an output npn bipolar transistor, 42, through a resistor, 43.

Current is supplied by the last-mentioned collector of transistor 35 to the emitter of transistor 38, to the base of transistor 39 and through resistor 43 to the base of transistor 42. The current in the base of transistor 39, varying in response to input signals, causes a variable collector current to be drawn thereby which must be supplied by the collector of transistor 40 to which it is connected and to a slight extent by the base of transistor 40. This causes substantially identical currents to be provided at the other collector of transistor 40 which is supplied, as previously indicated, to the emitter of transistor 38, the base of transistor 39, and the base of transistor 42 through the resistor 43. The extent of this positive feedback action is limited, however, by the presence of resistor 41 in the emitter of transistor 39. As an increasing voltage is dropped thereacross because of increasing emitter current in transistor 39, a much larger current is provided to the base of transistor 42 until the voltage at the base of transistor 39 is effectively damped by the base-to-emitter voltage of transistor 42. Greater current supplied at the base of transistor 39 by transistor 40 is thereafter increasingly shunted by transistor 38 from the base of transistor 39.

The much larger current supplied by the collector of transistor 40 to the base of transistor 42 through resistor 43 is the boost current used to drive transistor 42 to rpovide the amplifier load current. The emitter of trnsistor 52 is connected to ground reference terminal 11 while the collector of transistor 42 is connected to that terminal of the amplifier serving as an output, 44. Terminal 44 has shown electrically connected thereto a load device the other end of which is electrically connected to positive supply terminal 19.

This load device is shown to be primarily inductive in the symbol used therefor in FIG. 1, but this is not necessarily the impedance characteristic of possible loads but rather a typical characteristic. Note that no other impedance means is connected between ground reference terminal 11 and positive supply means 19 other than this load device and the emitter to collector portion of transistor 42.

The portion of the current from the collector of transistor 40 which drives the base of transistor 42 is determined by the values of resistors 41 and 43 and by the emitter area of transistor 42 relative to that of transistor 39. A typical area ratio would be to have the emitter area of transistor 42 sixteen times that of transistor 39. Resistor 43 also serves to increase the proportion should transistor 42 have a relatively low current gain. The emitter area for transistor 38 must be chosen so that the base-to-emitter voltage drop of transistor 33 does not exceed that of transistor 42 so that it can always be capable of drawing current from the collector of transistor 40 connected thereto. This allows transistor 42 to have an extremely low current provided thereto to permit a full output transistor operating range.

The voltage developed at amplifier output 44, across the load device, is fed back through a resistor, 45, to the junction of resistor 29 and the emitter of transistor 27. The voltage at amplifier output 44, as a result, changes the current drawn through resistor 29 thereby changing the voltage occurring at the emitter of transistor 27. Since the currents through transistor 27 are set by the regulated current source connected to terminal 30, the voltage at the base and collector of transistor 27 must change by a similar amount, which change also occurs on the base of transistor 26. The change in voltage on the base of transistor 26 will, since the emitter-to-base voltage of transistor 26 is relatively constant, be reflected in the drop across resistor 28 which must primarily be reflected in the change in the collector current of transistor 26.

Thus, as indicated above, a signal on amplifier input 10 leading to a change in the current drawn at the collector of transistor 13 will be balanced by two changes. There will be a change in the current drawn from the input of the amplification arrangement between transistor 13 and output 44, leading to this change being amplified at amplifier output 44, and a change in the current supplied by the current source containing transistor 26 because of feedback from amplifier output 44 reflecting the change there.

The feedback provided by resistor 45 is essentially feedback based on the voltage drop across the load device connected between amplifier output 44 and positive supply voltage terminal 19. This voltage drop is used to essentially set the current drawn through resistor 45 to control the current supplied at the collector of transistor 26 to the collector of transistor 13.

This voltage feedback, however, is often not sufficient to reduce the resonances which would occur in the circuit of FIG. 1. To more fully reduce the variance in the frequency spectrum characterizing the circuit of FIG. 1 due to such resonances, the addition of current feedback is provided through the use of a further npn bipolar transistor, 46, having its emitter electrically connected to ground reference terminal 11, and another feedback resistor, 47. Transistor 46 is a transistor which substantially matches the construction used in transistor 42, but like transistor 39 has an emitter area which is only one sixteenth that of transistor 42. The base of transistor 46 is electrically connected to the base of transistor 42 so that it receives essentially the same drive current as does transistor 42. As a result, the collector current drawn by transistor 46 will be substantially a fixed fraction of that drawn by transistor 42 so that its current represents the load current drawn by transistor 42 as a basis for providing current feedback. Such feedback requires that a resistor be placed from the collector of transistor 46 at a terminal connection thereto, 48, to either amplifier output 44 or positive voltage supply terminal 19. Such resistors are shown in dashed line form in FIG. 1. The signal from terminal 48 is then fed back through resistor 47 to the same junction of resistor 29 and the emitter of transistor 27 as is the signal through resistor 45.

The use of transistor 46, with its collector current representing the load current flowing in transistor 42, in place of having a sense resistor in series with transistor 42 and the load device means permits the full output voltage range to be applied to the load device. There is no voltage change limitation for the load device connected to amplifier output 44 because of any series voltage drop due to a sensing element. Thus, in low voltage applications where the voltage on positive supply terminal 19 is quite small so that the voltage loss to a sensing resistor would be significant, an output voltage range reduction is avoided by the arrangement of FIG. 1.

The signal excursion limiting circuitry is shown in FIG. 1 to the left of transistor 13. A pair of pnp bipolar transistors, 49 and 50, each have a resistor electrically connected to the emitter thereof, 51 and 52, respectively. The other side of each of resistors 51 and 52 are electrically connected together and are connected to positive voltage supply terminal 19 through another resistor, 53. Transistors 49 and 50 each have an npn bipolar transistor, 54 and 55, respectively, as a current source load. These transistor pairs each have members which are well matched. Each of transistors 54 and 55 has its base connected to the collector of transistor 54 so that transistor 54 is a diode connected transistor. Since each of transistors 54 and 55 are matched and have the bases connected to the same point, each will sink essentially the same current therethrough to ground terminal reference 11 electrically connected to the emitters of each of these transistors.

The base of transistor 49 is electrically connected to terminal 20 adapted, as stated before, for connection to a well regulated current sink. Likewise, the base of transistor 50 is connected to terminal 30 which is also adapted for connection to a well regulated current sink, and which is a current sink which will draw the same current as that connected to terminal 20. Thus, similar conditions will occur at the bases of each of transistors 49 and 50 except for the feedback connection through resistors 45 and 47 which cause voltage differences between terminal 30 and terminal 20. Such differences in voltage between terminals 20 and 30 will lead to a differential voltage at the bases of transistors 49 and 50 resulting in a voltage change at the collector of transistor 50.

The collector of transistor 50 is electrically connected to the bases of two further transistors, 56 and 57. Transistor 56 is a pnp bipolar transistor connected through a resistor, 58, to an electrical terminal means, 59, adapted for connection to a source of well regulated positive voltage. Transistor 57 has its emitter connected through a further resistor, 60, to ground reference terminal 11. The collectors of transistors 56 and 57 are electrically connected together and to the base of transistor 13.

The bases of transistors 56 and 57 are also connected to a voltage divider network provided by a pair of resistors, 61 and 62, connected in series between regulated positive voltage terminal 59 and ground reference terminal 11. At the junction of these two resistors, a further resistor, 63, is electrically connected to both of the bases of transistors 56 and 57. These resistors, 61, 62 and 63, set the bias conditions on the bases of these transistors and are chosen, along with the regulated voltage value on terminal 59 and the threshold values of transistors 56 and 57, such that transistors 56 and 57 are not in the conducting condition in the quiescent state. However, a sufficient shift in voltage at the collectors of transistors 50 and 55 will lead to sufficient changes in the bases of transistors 56 and 57 to cause one or the other of them to conduct to thereby reduce the signal at the base of transistor 13.

A further terminal means, 64, is connected to the junction of resistors 51, 52 and 53 to permit eliminating the excursion limiting circuit from acting at all, or to permit varying levels of signal excursion limitation. This can be accomplished by connecting terminal 64 to ground reference terminal 11, to positive voltage supply terminal 19, or through a resistor to either.

Three capacitances, 65, 66 and 67, are used specifically in the circuit of FIG. 1. Capacitance 65 prevents overshoot from occurring during operation of the signal excursion limiting circuit just described. Capacitance 66 provides a frequency characteristic rolloff for the entire amplifier for frequencies past the range of normal hearing if used with a speaker as a load device. Capacitance 67 provides a frequency characteristic rolloff for the current boost portion of the circuitry described above. The capacitances are all formed as parallel plate capacitors in the monolithic integrated circuit chip in which the circuit of FIG. 1 is formed (excluding the load means and possibly excluding a resistor between terminal 48 and either of terminals 44 or 19).

The npn bipolar transistors used in the circuit of FIG. 1 all have the same constructional design and reasonably match one another with the exception of differences in emitter areas as already described. Similarly, the pnp bipolar transistors are all constructed the same in the monolithic integrated circuit with the exception of the number of collectors, as already described. Thus, the npn bipolar transistors reasonably match one another outside the corresponding exception, and the pnp bipolar transistors also reasonably match one another outside the exception corresponding thereto. The resistors in the circuit are formed by ion implantation in the monolithic integrated circuit chip. For a typical bipolar integrated circuit fabrication process, the capacitances might have values of 15 pf for capacitance 65, and 33 pf for each of capacitances 66 and 67. The resistors might be chosen to have the following resistance values in ohms:

| Resistors | Resistance Values |
|---|---|
| 12 | 16,000 |
| 14 | 16,000 |
| 17 | 16,000 |
| 18 | 16,000 |
| 21 | 6,000 |
| 23 | 74,000 |
| 24 | 16,000 |
| 25 | 16,000 |
| 28 | 16,000 |
| 29 | 16,000 |
| 32 | 32,000 |
| 36 | 8,000 |
| 41 | 2,000 |
| 43 | 1,500 |
| 45 | 160,000 |
| 47 | 160,000 |
| 51 | 32,000 |
| 52 | 32,000 |
| 53 | 64,000 |
| 58 | 16,000 |
| 60 | 16,000 |
| 61 | 64,000 |
| 62 | 64,000 |
| 63 | 100,000 |

Although the present invention has been described with reference to preferred embodiments, workers skilled in the art will recognize that changes may be made in form and detail without departing from the spirit and scope of the invention.

What is claimed is:

1. An amplifier having an input and an output, said amplifier comprising:
   a first controlled current controller having an input and an output such that current flowing at said first controlled current controller output is controlled in amount by signals occurring on said first controlled current controller input, said first controlled current controller input serving as said amplifier input;
   a second controlled current controller having an input and an output such that current flowing at said second controlled current controller output is controlled in amount by signals occurring on said second controlled current controller input, said second controlled current controller input being electrically connected to said first controlled current controller output, said second controlled current controller output serving as said amplifier output;
   a third controlled current controller having an input and an output such that current flowing at said third controlled current controller output is controlled in amount by signals occurring on said third controlled current controller input, said third controlled current controller input being electrically connected to said first controlled current controller output;
   a fourth controlled current controller having an input and an output such that current flowing at said fourth controlled current controller output is controlled in amount by signals occurring on said fourth controlled current controller input, said fourth controlled current controller output being electrically connected to said first controlled current controller output; and
   first and second feedback impedances each having first and second terminating regions between which each exhibits a selected impedance, said first and second feedback impedance first terminating regions each being electrically connected to said fourth controlled current controller input, said first feedback impedance second terminating region being electrically connected to said second controlled current controller output, and said second feedback impedance second terminating region being electrically connected to said third controlled current controller output.

2. The apparatus of claim 1 wherein said first controlled current controller is a voltage controlled current sink.

3. The apparatus of claim 2 wherein said first controlled current controller comprises a transistor means having first and second terminating regions and having a control region therein by which said first controlled current controller transistor means is capable of being directed, through electrical energization thereof, to effectively provide a conductive path of a selected conductivity between said first controlled current controller transistor means first and second terminating regions, said first controlled current controller transistor means control region being electrically connected to said first controlled current controller input and said first controlled current controller transistor means first terminating region being electrically connected to said first controlled current controller output, and wherein said first controlled current controller further comprises a first impedance having first and second terminating regions between which it exhibits a selected impedance, said first controlled current controller first impedance first terminating region being electrically connected to said first controlled current controller transistor means second terminating region and said first controlled current controller first impedance second terminating region being electrically connected to a first terminal means adapted for connection to a first source of voltage.

4. The apparatus of claim 1 wherein said second and third controlled current controllers are each a current sink and said fourth controlled current controller is a current source.

5. The apparatus of claim 4 wherein said fourth controlled current controller comprises first and second transistor means each having first and second terminating regions and having a control region therein by which each is capable of being directed, through electrical energization thereof, to effectively provide a conductive path of a selected conductivity between its first and second terminating regions, said fourth controlled current controller first transistor means control region and second terminating region being electrically connected together and to a first terminal means adapted for connection to a first current flow means, said fourth controlled current controller second transistor means control region being electrically connected to said first terminal means, said fourth controlled current control second transistor means second terminating region serving as said fourth controlled current controller output, and wherein said fourth controlled current controller further comprises first and second impedance means each having first and second terminating regions between which each exhibits a selected electrical impedance, said fourth controlled current controller first and second impedance means first terminating regions each being electrically connected together and to a second terminal means adapted for connection to a first source of voltage, said fourth controlled current controller first impedance means second terminating region being electrically connected to said fourth controlled current controller first transistor means first terminating region which serves as said fourth controlled current controller input, said fourth controlled current controller second impedance means second terminating region being electrically connected to said fourth controlled current controller second transistor means first terminating region.

6. The apparatus of claim 5 wherein said second and third controlled current controller inputs are each electrically connected to said first controlled current controller output through an amplification means, said amplification means having an input electrically connected to said first controlled current controller output and having an output electrically connected to each of said second and third controlled current controller inputs, said amplification means being capable of providing signals at said amplification means output which are substantially similar to signals provided at said amplification means input but of a larger magnitude.

7. The apparatus of claim 4 wherein said second and third controlled current controllers each comprise a transistor means having first and second terminating regions and having a control region therein by which each is capable of being directed, through electrical energization thereof, to effectively provide a conductive path of a selected conductivity between its first and second terminating regions, said second controlled current controller transistor means being formed substantially identically to said third controlled current controller transistor means, said second controlled current controller transistor means control region serving as said second controlled current controller input, said third controlled current controller transistor means control region serving as said third controlled current controller input, said second controlled current controller transistor means first terminating region serving as said second controlled current controller output, and said third controlled current controller transistor means first terminating region serving as said third controlled current controller output, said second controlled current controller transistor means second terminating region and said third controlled current controller transistor means second terminating region each being electrically connected to a first terminal means adapted for connection to a first source of voltage.

8. The apparatus of claim 1 wherein said first controlled current controller comprises a transistor means having first and second terminating regions and having a control region therein by which said first controlled current controller transistor means is capable of being directed, through electrical energization thereof, to effectively provide a conductive path of a selected conductivity between said first controlled current controller transistor means first and second terminating regions, said first controlled current controller transistor means control region being electrically connected to said first controlled current controller input and said first controlled current controller transistor means first terminating region being electrically connected to said first controlled current controller output, and wherein said first controlled current controller further comprises a first impedance having first and second terminating regions between which it exhibits a selected impedance, said first controlled current controller first impedance first terminating region being electrically connected to said first controlled current controller transistor means second terminating region and said first controlled current controller first impedance second terminating region being electrically connected to a first terminal means adapted for connection to a first source of voltage.

9. The apparatus of claim 8 wherein said fourth controlled current controller comprises first and second transistor means each having first and second terminating regions and having a control region therein by which each is capable of being directed, through electrical energization thereof, to effectively provide a conductive path of a selected conductivity between its first and second terminating regions, said fourth controlled current controller first transistor means control region and second terminating region being electrically connected together and to a second terminal means adapted for connection to a first current flow means, said fourth controlled current controller second transistor means control region being electrically connected to said second terminal means, said fourth controlled current control second transistor means second terminating region serving as said fourth controlled current controller output, and wherein said fourth controlled current controller further comprises first and second impedance means each having first and second terminating regions between which each exhibits a selected electrical impedance, said fourth controlled current controller first and second impedance means first terminating regions each being electrically connected together and to a third terminal means adapted for connection to a second source of voltage, said fourth controlled current controller first impedance means second terminating region being electrically connected to said fourth controlled current controller first transistor means first terminating region which serves as said fourth controlled current controller input, said fourth controlled current controller second impedance means second terminating region being electrically connected to said fourth controlled current controller second transistor means first terminating region.

10. The apparatus of claim 9 wherein said ssecond and third controlled current controllers each comprise a transistor means having first and second terminating regions and having a control region therein by which each is capable of being directed, through electrical energization thereof, to effectively provide a conductive path of a selected conductivity between its first and second terminating regions, said second controlled current controller transistor means being formed substantially identically to said third controlled current controller transistor means, said second controlled current controller transistor means control region serving as said second controlled current controller input, said third controlled current controller transistor means control region serving as said third controlled current controller input, said second controlled current controller transistor means first terminating region serving as said second controlled current controller output, and said third controlled current controller transistor means first terminating region serving as said third current controller output, said second controlled current controller transistor means second terminating region and said third controlled current controller transistor means second terminating region each being electrically connected to said first terminal means.

11. The apparatus of claim 1 wherein said fourth controlled current controller comprises first and second transistor means each having first and second terminating regions and having a control region therein by which each is capable of being directed, through electrical energization thereof, to effectively provide a conductive path of a selected conductivity between its first and second terminating regions, said fourth controlled current controller first transistor means control region and second terminating region being electrically connected together and to a first terminal means adapted for connection to a first current flow means, said fourth controlled current controller second transistor means control region being electrically connected to said first terminal means, said fourth controlled current control second transistor means second terminating region serving as said fourth controlled current controller output, and wherein said fourth controlled current controller further comprises first and second impedance means each having first and second terminating regions between which each exhibits a selected electrical impedance, said fourth controlled current controller first and second impedance means first terminating regions each being electrically connected together and to a second terminal means adapted for connection to a first source of voltage, said fourth controlled current controller first impedance means second terminating region being electrically connected to said fourth controlled current controller first transistor means first terminating region which serves as said fourth controlled current controller input, said fourth controlled current controller second impedance means second terminating region being electrically connected to said fourth controlled current controller second transistor means first terminating region.

12. The apparatus of claim 11 wherein a supplementary impedance means having first and second terminating regions between which it exhibits a selected impedance, said supplementary impedance first transmission region being electrically connected to said second terminal means, and said supplementary impendance second terminating region being electrically connected to said third controlled current controller output.

13. The apparatus of claim 11 wherein a supplementary impedance means having first and second terminating regions between which it exhibits a selected impedance, said supplementary impedance first transmission region being electrically connected to said second controlled current controller output, and said supplementary impendance second terminating region being electrically connected to said third controlled current controller output.

14. The apparatus of claim 1 wherein said second and third controlled current controllers each comprise a transistor means having first and second terminating regions and having a control region therein by which each is capable of being directed, through electrical energization thereof, to effectively provide a conductive path of a selected conductivity between its first and second terminating regions, said second controlled current controller transistor means being formed substantially identically to said third controlled current controller transistor means, said second controlled current controller transistor means control region serving as said second controlled current controller input, said third controlled current controller transistor means control region serving as said third controlled current controller input, said second controlled current controller transistor means first terminating region serving as said second controlled current controller output, and said third controlled current controller transistor means first terminating region serving as said third controlled current controller output, said second controlled current controller transistor means second terminating region and said third controlled current controller transistor means second terminating region each being electrically connected to a first terminal means adapted for connection to a first source of voltage.

15. The apparatus of claim 14 wherein said second and third controlled current controller inputs are each electrically connected to said first controlled current controller output through an amplification means, said amplification means having an input electrically connected to said first controlled current controller output and having an output electrically connected to each of said second and third controlled current controller inputs, said amplification means being capable of providing signals at said amplification means output which are substantially similar to signals provided at said amplification means input but of a larger magnitude.

16. The apparatus of claim 1 wherein said second and third controlled current controller inputs are each electrically connected to said first controlled current controller output through an amplification means, said amplification means having an input electrically connected to said first controlled current controller output and having an output electrically connected to each of said second and third controlled current controller inputs, said amplification means being capable of providing signals at said amplification means output which are substantially similar to signals provided at said amplification means input but of a larger magnitude.

17. The apparatus of claim 1 wherein a load device is connected between said amplifier output and a first terminal means adapted for connection to a first source of voltage.

18. The apparatus of claim 1 wherein there is provided a supplementary impedance means having first and second terminating regions between which it exhibits a selected impedance, said supplementary impedance first terminating region being electrically connected to said second controlled current controller output, and said supplementary impendance second terminating region being electrically connected to said third controlled current controller output.

19. The apparatus of claim 1 wherein there is further provided a signal excursion control means which senses signal levels occurring at said fourth controlled current controller input and, for signals exceeding a selected level, alters electrical conditions at said first controlled current controller input.

* * * * *